United States Patent
Diorio et al.

(10) Patent No.: US 7,411,829 B2
(45) Date of Patent: Aug. 12, 2008

(54) METHOD AND APPARATUS FOR PROGRAMMING SINGLE-POLY PFET-BASED NONVOLATILE MEMORY CELLS

(76) Inventors: Christopher J. Diorio, 17007 NW. 15th Ave., Shoreline, WA (US) 98177; Todd E. Humes, 817 NW. 200th St., Shoreline, WA (US) 98177

( * ) Notice: Subject to any disclaimer, the term of this patent is extended or adjusted under 35 U.S.C. 154(b) by 90 days.

(21) Appl. No.: 11/528,262

(22) Filed: Sep. 26, 2006

(65) Prior Publication Data
US 2007/0019477 A1 Jan. 25, 2007

Related U.S. Application Data

(60) Division of application No. 10/936,282, filed on Sep. 7, 2004, now Pat. No. 7,149,118, which is a continuation-in-part of application No. 10/245,183, filed on Sep. 16, 2002, now Pat. No. 6,853,583.

(51) Int. Cl.
*G11C 11/34* (2006.01)
(52) U.S. Cl. ............................. 365/185.18; 365/185.14
(58) Field of Classification Search ............ 365/185.18, 365/185.14, 185.21, 185.28
See application file for complete search history.

(56) References Cited

U.S. PATENT DOCUMENTS

| | | | |
|---|---|---|---|
| 4,935,702 A | 6/1990 | Mead et al. |
| 4,953,928 A | 9/1990 | Anderson et al. |
| 5,146,106 A | 9/1992 | Anderson et al. |
| 5,301,150 A | 4/1994 | Sullivan et al. |
| 5,596,524 A | 1/1997 | Lin et al. |
| 5,616,942 A | 4/1997 | Song |
| 5,617,358 A | 4/1997 | Kodama |
| 5,623,442 A | 4/1997 | Gotou et al. |
| 5,627,392 A | 5/1997 | Diorio et al. |
| 5,650,966 A | 7/1997 | Cleveland et al. |
| 5,687,118 A | 11/1997 | Chang |

(Continued)

FOREIGN PATENT DOCUMENTS

EP 0 778 623 6/1997

(Continued)

OTHER PUBLICATIONS

Chang, et al., "A CMOS-Compatible Single-Poly Cell for Use as Non- Volatile Memory", International Semiconductor Device Date Research Symposium, Dec. 1-3, 1999, pp. 50-57.

(Continued)

*Primary Examiner*—Anh Phung
(74) *Attorney, Agent, or Firm*—Thelen Reid Brown Raysman & Steiner LLP; David B. Ritchie

(57) ABSTRACT

Methods and apparatuses for programming a single-poly pFET-based nonvolatile memory cell bias the cell so that band-to-band tunneling (BTBT) is induced and electrons generated by the BTBT are injected onto a floating gate of the cell. Following a predetermined event, the single-poly pFET is biased to induce impact-ionized hot-electron injection (IHEI). The predetermined event may be, for example, the expiration of a predetermined time period or a determination that a channel has been formed by the BTBT injection process that is sufficiently conducting to support IHEI. Employing BTBT permits a previously overerased or stuck bit to be "unstuck" or "removed" and thus be made usable (i.e., able to be programmed) again.

13 Claims, 10 Drawing Sheets

U.S. PATENT DOCUMENTS

| | | | |
|---|---|---|---|
| 5,706,227 | A | 1/1998 | Chang et al. |
| 5,736,764 | A | 4/1998 | Chang |
| 5,754,471 | A | 5/1998 | Peng et al. |
| 5,761,121 | A | 6/1998 | Chang |
| 5,763,912 | A | 6/1998 | Parat et al. |
| 5,777,361 | A | 7/1998 | Parris et al. |
| 5,786,617 | A | 7/1998 | Merrill et al. |
| 5,825,063 | A | 10/1998 | Diorio et al. |
| 5,841,165 | A | 11/1998 | Chang et al. |
| 5,844,300 | A | 12/1998 | Alavi et al. |
| 5,892,709 | A | 4/1999 | Parris et al. |
| 5,898,613 | A | 4/1999 | Diorio et al. |
| 5,912,842 | A | 6/1999 | Chang et al. |
| 5,969,987 | A | 10/1999 | Blyth et al. |
| 5,990,512 | A | 11/1999 | Diorio et al. |
| 6,028,789 | A | 2/2000 | Mehta et al. |
| 6,049,229 | A | 4/2000 | Manohar et al. |
| 6,055,185 | A | 4/2000 | Kalnitsky et al. |
| 6,081,451 | A | 6/2000 | Kalnitsky et al. |
| 6,137,721 | A | 10/2000 | Kalnitsky et al. |
| 6,137,722 | A | 10/2000 | Kalnitsky et al. |
| 6,137,723 | A | 10/2000 | Bergemont et al. |
| 6,137,724 | A | 10/2000 | Kalnitsky et al. |
| 6,166,954 | A | 12/2000 | Chern |
| 6,208,557 | B1 | 3/2001 | Bergemont et al. |
| 6,222,771 | B1 | 4/2001 | Tang et al. |
| 6,294,810 | B1 | 9/2001 | Li et al. |
| 6,320,788 | B1 | 11/2001 | Sansbury et al. |
| 6,385,000 | B1 | 5/2002 | Ottesen et al. |
| 6,385,090 | B1 | 5/2002 | Kitazaki |
| 6,452,835 | B1 | 9/2002 | Diorio et al. |
| 6,534,816 | B1 | 3/2003 | Caywood |
| 6,678,190 | B2 | 1/2004 | Yang et al. |
| 6,898,123 | B2 | 5/2005 | Owen |
| 6,909,389 | B1 | 6/2005 | Hyde et al. |
| 6,950,342 | B2 * | 9/2005 | Lindhorst et al. ...... 365/185.21 |
| 7,046,549 | B2 * | 5/2006 | Lee et al. ............... 365/185.05 |
| 2003/0206437 | A1 | 11/2003 | Diorio et al. |
| 2004/0004861 | A1 | 1/2004 | Srinivas et al. |
| 2004/0052113 | A1 | 3/2004 | Diorio et al. |
| 2004/0206999 | A1 | 10/2004 | Hyde et al. |
| 2007/0252701 | A1 | 11/2007 | Berry et al. |

OTHER PUBLICATIONS

Diorio, "A p-Channel MOS Synapse Transistor with Self-Convergent Memory Writes", IEEE Transactions On Electron Devices, vol. 47, No. 2, pp. 464-472, Feb. 2000.

Lanzoni et al., "A Novel Approach to Controlled Programming of Tunnel-Based Floating-Gate MOSFET's", 1994, IEEE Journal of Solid-State Circuits, vol. 29, No. 2, pp. 147-150.

Ohsaki, et al., "A Single Poly EEPROM Cell Structure for Use in Standard CMOS Processes", IEEE Journal of Solid-State Circuits, vol. 29, No. 3, Mar. 1994, pp. 311-316.

Invitation to Pay Additional Fees (Partial International Search), Application No. PCT/US 03/31792, date of mailing Apr. 2, 2004.

International Search Report for International Application No. PCT/US03/23724, dated mailed Jan. 20, 2004.

International Search Report, for International Application No. PCT/US2005/013644, date mailed Aug. 3, 2005.

* cited by examiner

METHOD AND APPARATUS FOR PROGRAMMING SINGLE-POLY PFET-BASED NONVOLATILE MEMORY CELLS

RELATED APPLICATIONS

This application is a divisional of and commonly assigned U.S. patent application Ser. No. 10/936,282 filed on Sep. 7, 2004, now U.S. Pat. No. 7,149,118, issued on Dec. 12, 2006which is, in turn, a continuation-in-part of commonly assigned U.S. patent application Ser. No. 10/245,183 filed Sep. 16, 2002 now U.S. Pat. No. 6,853,583 in the name of inventors Christopher J. Diorio, Troy N. Gilliland, Chad A. Lindhorst, Alberto Pesavento and Shailendra Srinivas, and entitled "Method and Apparatus for Preventing Overtunneling in pFET-Based Nonvolatile Memory Cells".

This application is also related to co-pending and commonly assigned U.S. patent application Ser. No. 10/936,283 filed on Sep. 7, 2004 in the name of inventors Troy N. Gilliland, Chad A. Lindhorst, Christopher J. Diorio, Todd E. Humes and Shailendra Srinivas, and entitled "PMOS Memory Cell".

FIELD OF THE INVENTION

The present invention relates generally to nonvolatile memory (NVM) cells. More particularly, the present invention relates to methods and apparatus for programming single-poly pFET-based NVM cells.

BACKGROUND OF THE INVENTION

Demand for embedded nonvolatile memory (NVM) in integrated circuits has grown steadily over the past decade. Desirable characteristics of embedded NVM include low cost, low power, high speed, and high reliability (data retention and program/erase cycling endurance). NVM may be embedded in various integrated circuit (IC) technologies Such as, for example, the widely used Complementary Metal Oxide Semiconductor (CMOS) technology. Some embedded NVM in CMOS applications include, for example, storing: (1) chip serial numbers, (2) configuration information in ASICs (Application Specific Integrated Circuits), (3) product data, security information and/or serial numbers in radio frequency identification integrated circuits, (4) program code or data in embedded microcontrollers, (5) analog trim information, and the like.

Traditional embedded EEPROM (electrically erasable programmable read only memory) or Flash NVM memory technology use NMOS (n-channel Metal Oxide Semiconductor) memory cells (i.e. "nFET-based" nonvolatile memory cells). FIG. 1 is a cross-sectional diagram of a double-poly nFET-based nonvolatile memory (NVM) cell in accordance with the prior art. FIG. 1 shows an nFET-based nonvolatile memory cell 10 manufactured using a double-poly process (i.e. a fabrication process that forms a device having two layers of polysilicon). A first n+ doped region 12, formed in a p– doped substrate 14, embodies the source of the memory cell 10, and a second n+ doped region 16 embodies the drain of the memory cell 10. A channel region 18 extends between the source 12 and drain 16 regions. A polysilicon floating gate 20 is insulated from the channel region 18 and the substrate 14 by a gate dielectric layer 22. A polysilicon control gate 24 is insulated from the floating gate 20 by a second dielectric layer 26.

FIG. 2 is a cross-sectional diagram of a double-poly nFET-based NVM cell 10 in accordance with the prior art illustrating how channel hot-electron injection is used to inject electrons onto a floating gate of the device of FIG. 1. The memory state of the memory cell 10 is defined by the floating-gate voltage, $V_{FG}$, which is varied by controlling the number of electrons stored on the floating gate 20. $V_{FG}$ is reduced by adding electrons to the floating gate 20. To add electrons to the floating gate 20, and thereby lower $V_{FG}$, a large positive voltage (e.g., about 10V depending on the thickness of the dielectrics) is applied to the control gate 24 (i.e., the control gate is "pulled up"), while the drain 16 is positively biased (e.g., to about 5V depending on the thickness of the dielectrics) relative to the source 12.

Under these bias conditions, and as illustrated in FIG. 2, electrons are accelerated from the source 12, across the channel region 18, to the drain region 16. As the accelerated electrons traverse the channel 18 they collide with atoms of the semiconductor lattice and generate what are known as "hot electrons". These hot electrons are attracted to the positive voltage applied to the control gate 24, and, by a process known as "channel hot-electron injection" (CHEI), are injected through the gate dielectric layer 22 and onto the floating gate 20. The floating-gate potential or voltage, $V_{FG}$, is increased by removing electrons from the floating gate 20. To remove electrons from the floating gate 20, a large positive voltage (e.g., about 10V (depending on the thickness of the dielectric)) is applied to the source 12 of the memory cell 10 while the control gate 24 is either grounded or negatively biased. Under these bias conditions, a process known as Fowler-Nordheim (F-N) tunneling occurs, whereby electrons stored on the floating gate 20 are removed by F-N tunneling through the gate dielectric layer 22 and into the source 12.

Whereas nFET-based nonvolatile memory cells have been used for many years, it has been demonstrated that pFET-based nonvolatile memory cells exhibit a number of performance advantages over nFET-based nonvolatile memory cells. Some of these performance advantages include (1) increased program/erase cycle endurance (due to reduced oxide wear-out); (2) availability in logic CMOS processes (due to reduced memory leakage arising from more favorable oxide physics); (3) ability to easily store analog as well as digital values (due to availability of precise memory writes); and (4) smaller on-chip charge pumps (due to decreased charge pump current requirements.

FIG. 3 is a cross-sectional diagram of a conventional double-poly pFET-based NVM cell 28 in accordance with the prior art. A first p+ doped region 30, formed in an n– doped well 32 of a p– substrate 34, embodies the source of the memory cell 28, and a second p+ doped region 36 embodies the drain of the memory cell 28. A channel region 38 extends between the source 30 and drain 36 regions. A polysilicon floating gate 40 is insulated from the channel region 38 by a gate dielectric layer 42. A polysilicon control gate 44 is insulated from the floating gate 40 by a second dielectric layer 46.

Similar to the nFET-based nonvolatile memory cell 10 shown in FIG. 1, the memory state of the pFET-based nonvolatile memory cell 28 shown in FIG. 3 is defined by the floating-gate voltage, $V_{FG}$, which is varied by controlling the number of electrons stored on the floating gate 40. To add electrons to the floating gate 40, and thereby lower $V_{FG}$, the source 30 and n– doped well 32 are biased to about 3V, the drain 36 is biased to about –1.5V, and the control gate 44 is biased low enough that holes flow across the channel region 38.

FIG. 4 is a cross-sectional diagram of a double-poly pFET-based NVM cell in accordance with the prior art illustrating how impact-ionized hot-electron injection is used to inject electrons onto a floating gate of the device of FIG. 3.

Under these bias conditions, and as illustrated in FIG. 4, holes are accelerated from the source 30, across the channel region 38, and to the drain region 36. As the accelerated holes traverse the channel region 38 and enter a drain depletion region 48 in the vicinity of the drain 36/n– well 32 junction, the holes may collide with atoms of the semiconductor lattice and generate electron-hole pairs. This phenomenon is known as "impact ionization". The generated holes are typically collected by the drain 36, while the generated electrons are expelled from the drain depletion region with a high kinetic energy attributable to a high electric field in the drain depletion region 48. Those high-energy electrons which collide with the semiconductor lattice may be scattered upward and, attracted by the higher potential of floating gate 40, and may then be injected into the conduction band of the gate dielectric layer 42 and onto the floating gate 40. This process is known as "impact-ionized hot-electron injection" (IHEI). Whereas the floating-gate voltage, $V_{FG}$, is decreased by IHEI, the floating-gate voltage, $V_{FG}$, is increased by removing electrons from the floating gate 40. To remove electrons from the floating gate 40, a voltage of approximately 10V (depending upon the thickness of the dielectric) is applied to one or more of the source 30, n– well 32 (via n– well contact 33 which may be an n+ region), and drain 36, while the control gate 44 is typically grounded. Under these bias conditions, Fowler-Nordheim tunneling occurs and electrons stored on the floating gate 40 tunnel through the gate dielectric layer 42 and into the source 30, n– well 32 and/or drain 36 regions.

Although pFET-based nonvolatile memory cells have significant performance advantages over nFET-based nonvolatile memory cells, pFET-based nonvolatile memory cells can be troubled by a phenomenon often referred to as the "stuck bit" phenomenon. Stuck bits in pFET-based nonvolatile memory cells manifest themselves as follows.

Certain pFET-based nonvolatile memory cells use Fowler-Nordheim tunneling to raise the floating-gate voltage, $V_{FG}$, and IHEI to lower $V_{FG}$. One requirement of IHEI, however, is that the pFET channel must be conducting current so that electrons can be generated by impact ionization and injected onto the floating gate. If the channel is not conducting then IHEI cannot ensue and, consequently, electrons cannot be injected onto the floating gate of the pFET-based nonvolatile memory cell in order to program it. There are two primary ways in which a channel can be rendered insufficiently conducting to support IHEI. First, post-fabrication charge stored on the floating gate of a memory cell may prevent a conducting channel from forming. Second, a once established conducting channel may be removed by way of excessive erasure of the memory cell by Fowler-Nordheim tunneling. Effectively, by "overtunneling" the memory cell, the memory cell becomes "stuck" in an off state, and, in the absence of channel current, no electron injection can be performed to lower the floating-gate voltage. In any circumstance, if the floating-gate voltage, $V_{FG}$, is raised so high that the pFET is turned off, there will be insufficient channel current to program the memory cell, and the memory value of the memory cell is said to be "stuck".

To avoid the stuck bit problem, conventional double-poly pFET-based nonvolatile memory cells take advantage of the presence of a control gate (e.g. as discussed above in connection with FIG. 3) to help ensure that a conducting channel is maintained to support IHEI. By applying an appropriate voltage to the control gate while tunneling electrons off of the floating gate, a sufficiently conducting channel can be maintained for subsequent writes to the memory cell.

Whereas double-poly pFET-based nonvolatile memory cells are able to use the control gate to avoid the stuck bit problem, their use is limited by not being easily integrated in standard logic CMOS processes, which are typically single-poly processes.

FIG. 5 is a cross-sectional diagram of a single-poly-based NVM cell in accordance with the prior art which attempts to overcome limitations associated with the double-poly pFET-based NVM cell shown in FIG. 3 by using a specially formed control-gate structure. In FIG. 5 a single-poly pFET-based nonvolatile memory cell 50, as disclosed in U.S. Pat. No. 5,761,121, attempts to overcome the limitations of the double-poly pFET-based nonvolatile memory cells. The pFET-based nonvolatile memory cell 50 includes a storage transistor 52, having a drain 54, a source 56, and a floating gate 58. The pFET-based nonvolatile memory cell 50 also includes a separate control-gate structure 60, having a control-gate implant 62. Drain region 54 is surrounded by drain depletion region 64 and, like source region 56 and control gate implant 62 (which may be p doped) is disposed in n– well 66 of p– substrate 68. Unfortunately, although pFET-based nonvolatile memory cell 50 does not require a double-poly CMOS process, it does require additional processing steps to form the control-gate structure 60, thereby negating many of the benefits of standard-CMOS compatibility and causing higher manufacturing costs and potentially lower yields.

What is needed, therefore, are programming methods and structures that avoid stuck bits in pFET-based nonvolatile memory cells, the strictures of which are compatible with standard single-poly CMOS fabrication processes and do not require custom masking and fabrication steps beyond that employed in standard CMOS fabrication processes.

SUMMARY OF THE INVENTION

Methods and apparatuses for programming a single-poly pFET-based nonvolatile memory cell bias the cell so that band-to-band tunneling (BTBT) is induced and electrons generated by the BTBT are injected onto a floating gate of the cell. Following a predetermined event, the single-poly pFET is biased to induce impact-ionized hot-electron injection (IHEI). The predetermined event may be, for example, the expiration of a predetermined time period or a determination that a channel has been formed by the BTBT injection process that is sufficiently conducting to support IHEI. Employing BTBT permits a previously overerased or stuck bit to be "unstuck" or "removed" and thus be made usable (i.e., able to be programmed) again.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
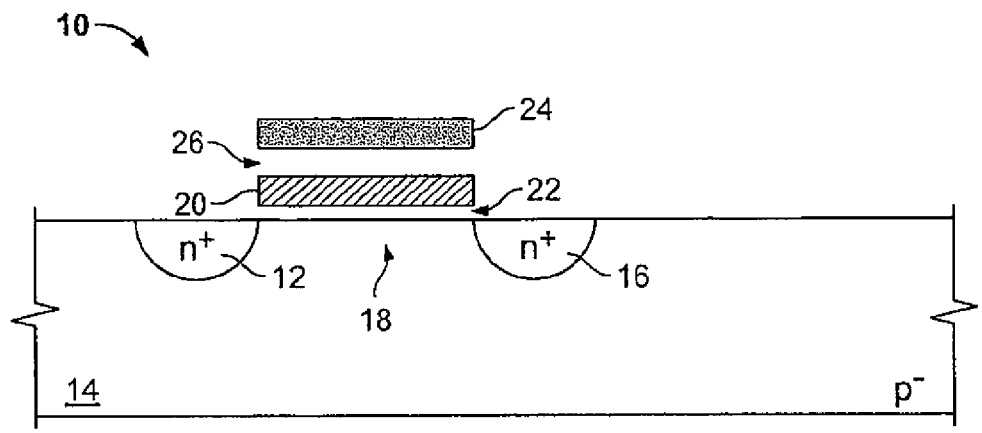
FIG. 1 is a cross-sectional diagram of a double-poly nFET-based nonvolatile memory (NVM) cell in accordance with the prior art.
Figure 2:
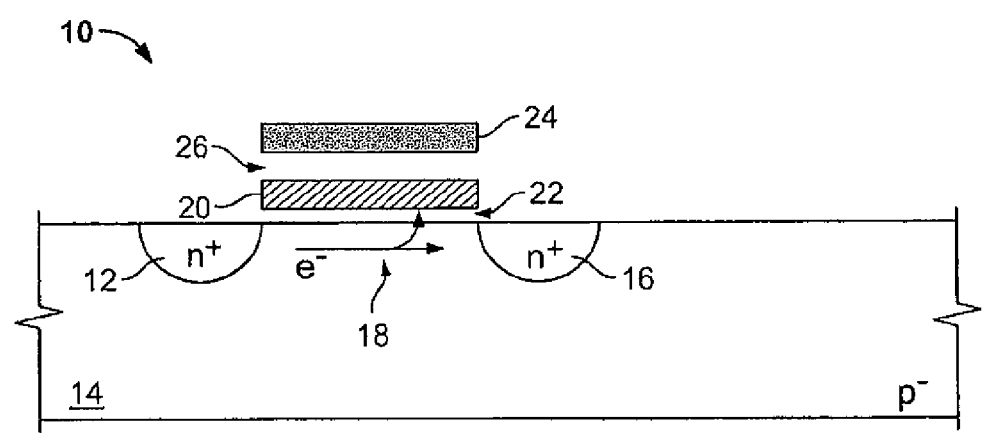
FIG. 2 is a cross-sectional diagram of a double-poly nFET-based NVM cell in accordance with the prior art illustrating how channel hot-electron injection (CHEI) is used to inject electrons onto a floating gate of the device of FIG. 1.
Figure 3:
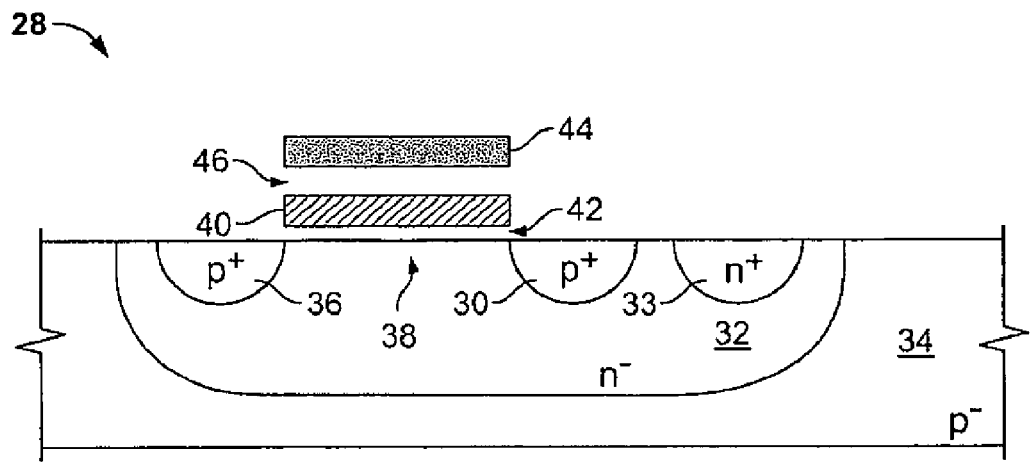
FIG. 3 is a cross-sectional diagram of a double-poly pFET-based NVM cell in accordance with the prior art.

Embodiments of the present invention described in the following detailed description are directed at methods and apparati for programming single-poly pFET-based nonvolatile memory cells. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{21}$ atoms per cubic centimeter. The symbol n− indicates an n-doped semiconductor material typically having a doping level on the order of $10^{17}$ atoms per cubic centimeter. The symbol p+ indicates a p-doped semiconductor material typically having a doping level of p-type dopants on the order of $10^{21}$ atoms per cubic centimeter. The symbol p− indicates a p-doped semiconductor material typically having a doping level on the order of $10^{17}$ atoms per cubic centimeter for p− wells and a doping level on the order of $10^{15}$ atoms per cubic centimeter for p− substrate material. Those of ordinary skill in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skill in the art. Such persons of ordinary skill in the art will now also realize that a range of doping concentrations around those described above will also work. Essentially, any process capable of forming pFETs and nFETs will work. Doped regions may be diffusions or they may be implanted.

Reference will now be made in detail to implementations of the present invention as illustrated in the accompanying drawings. The same reference indicators will be used throughout the drawings and the following detailed description to refer to the same or similar parts.

Figure 4:
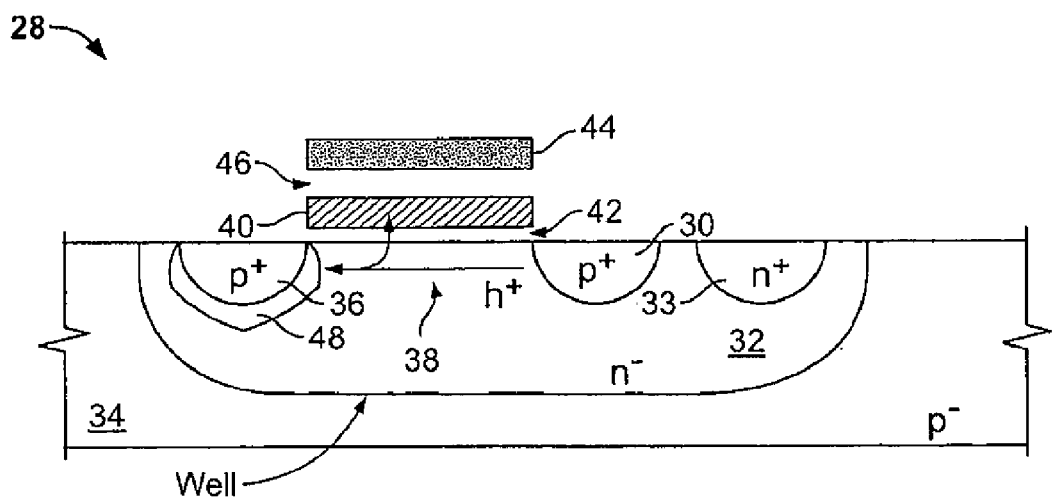
FIG. 4 is a cross-sectional diagram of a double-poly pFET-based NVM cell in accordance with the prior art illustrating how impact-ionized hot-electron injection (IHEI) is used to inject electrons onto a floating gate of the device of FIG. 3.
Figure 5:
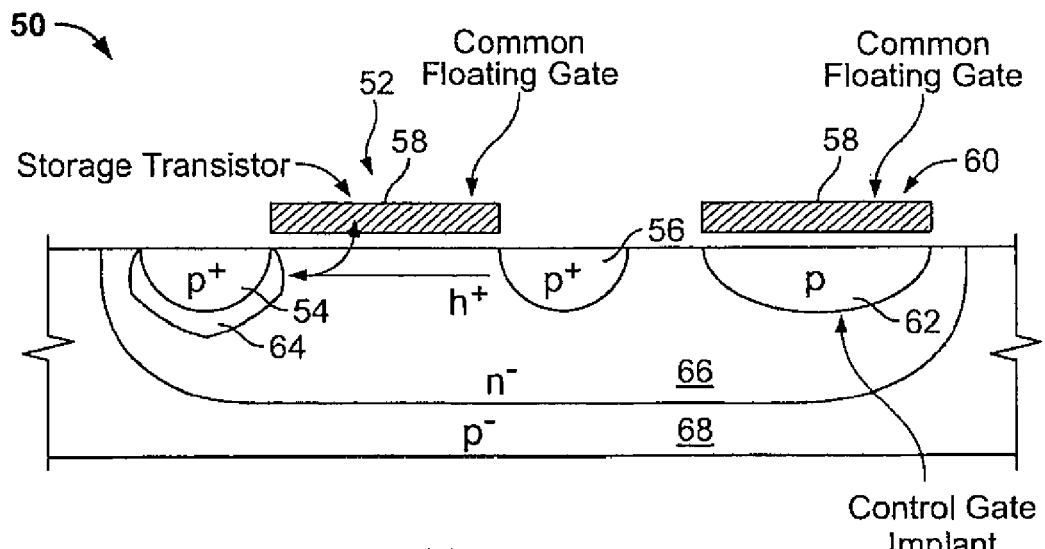
FIG. 5 is a cross-sectional diagram of a single-poly-based NVM cell in accordance with the prior art which attempts to overcome limitations associated with the double-poly pFET-based NVM cell shown in FIG. 3 by using a specially formed control-gate structure.
Figure 6:
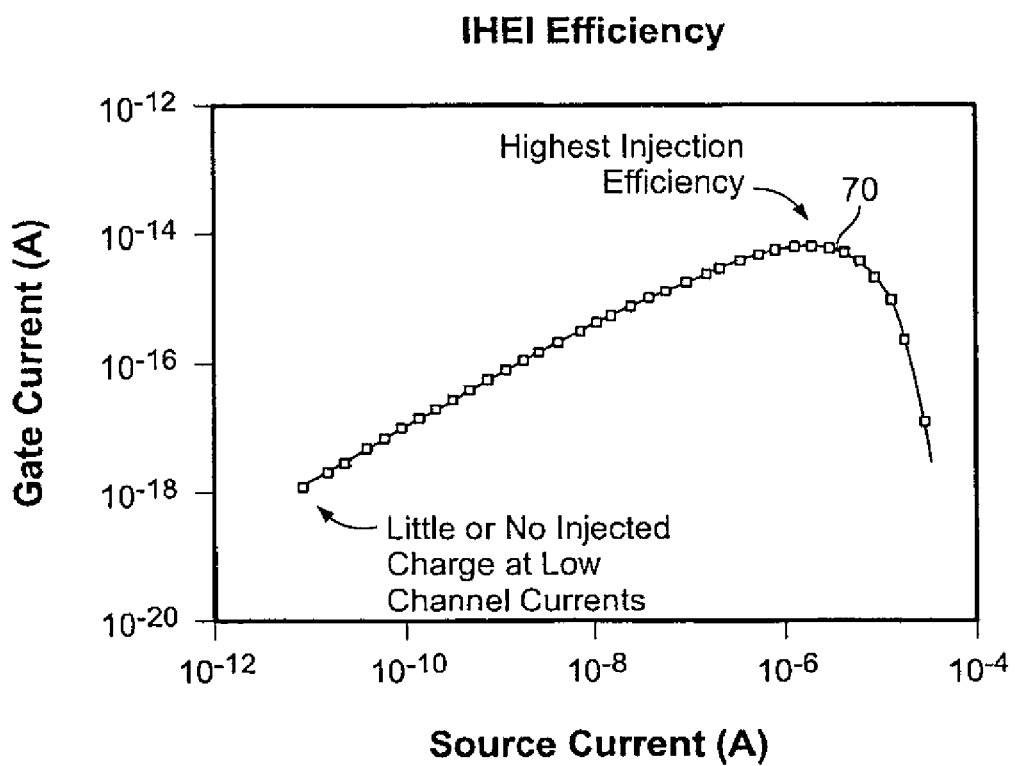
FIG. 6 is a graph of gate current versus source current that is characteristic of the single-poly pFET-based NVM cell shown in FIGS. 9A and 9B.
Figure 9A:
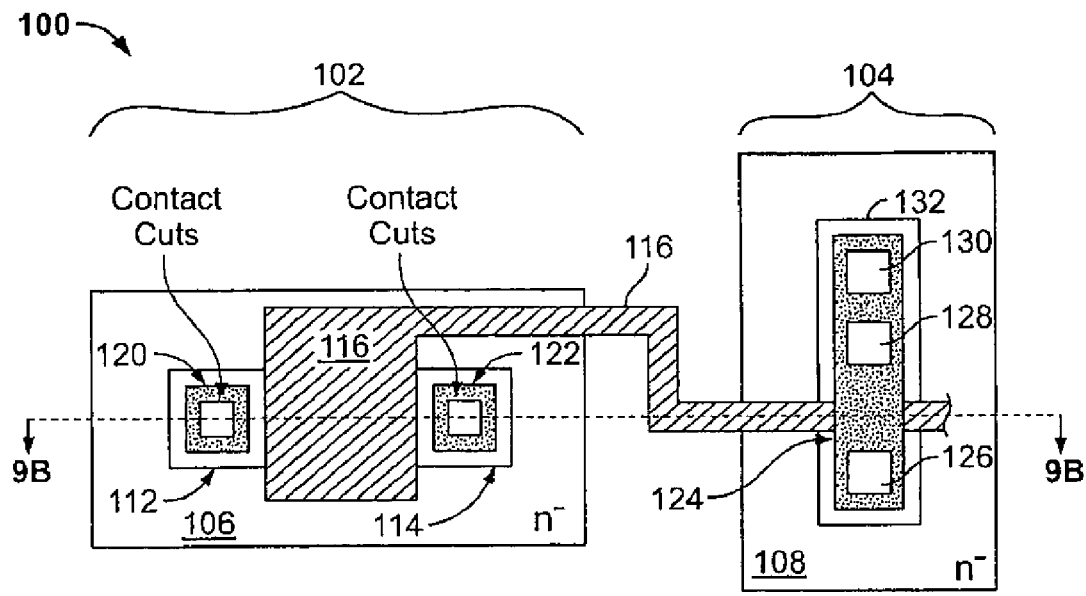
FIG. 9A is a top layout view of a single-poly pFET-based NVM cell which may be programmed using the programming apparatus shown in FIGS. 7A and 7B and the programming method illustrated in the diagram of FIG. 8, or the programming apparatus shown in FIG. 11 and the programming method of FIG. 12 in accordance with an embodiment of the present invention.
Figure 9B:
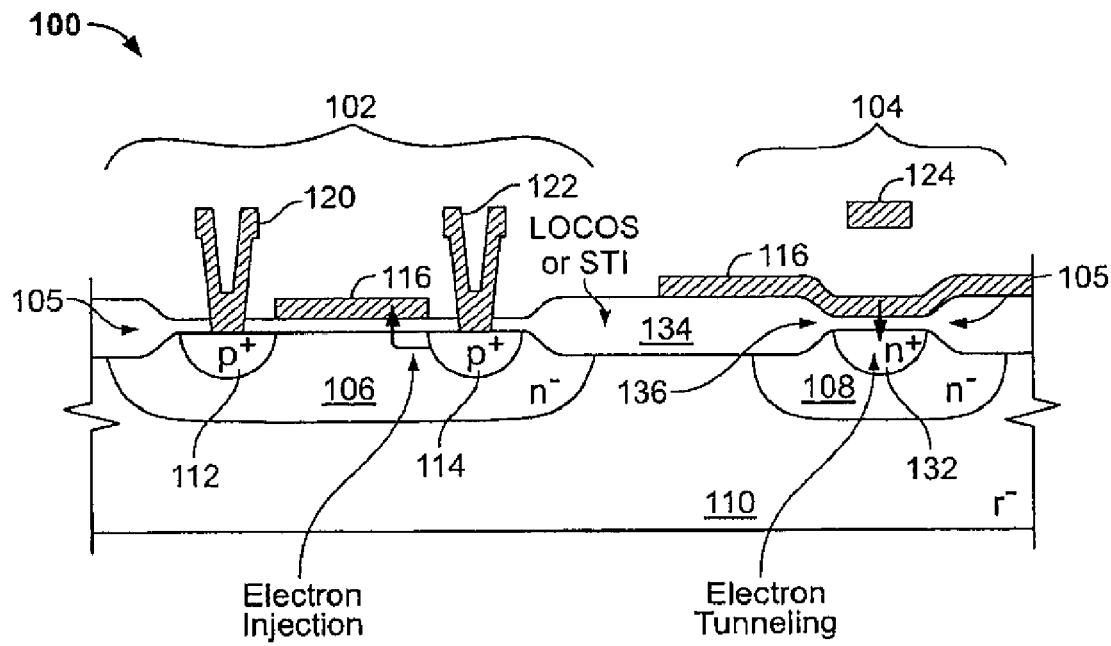
FIG. 9B is a cross-sectional diagram taken along line 9B-9B of FIG. 9A of the single-poly pFET-based nonvolatile memory cell of FIG. 9A.

FIG. 6 shows a curve 70 of gate-current (in amperes) versus source-current (also in amperes) for a single-poly pFET-based NVM in accordance with an embodiment of the present invention such as that illustrated in FIGS. 9A and 9B. The curve illustrates how the magnitude of the IHEI gate current changes as the pFET's source current is varied. For small source currents (i.e. less than $10^{-10}$ A (amperes)) the gate current is small because there are few channel holes to undergo impact-ionization. Under such conditions injecting electrons onto the floating gate of a pFET-based nonvolatile memory cell is slow. As the source current increases within the range of about $10^{-10}$ A to $10^{-6}$ A, the gate current increases with source current, allowing rapid injection of electrons onto the floating gate of a pFET-based nonvolatile memory cell. For channel currents exceeding $10^{-6}$ A the gate current falls because channel holes tend to lose too much energy in their path along the channel, leaving insufficient energy for impact ionization in the channel-to-drain depletion region (see FIG. 4).

Band-to-band tunneling (BTBT) operates by accumulating the pFET channel, thereby narrowing the depletion region around the drain and enhancing the BTBT generation rate. This process is self-limiting, however, because electron generation reduces the channel-to-drain electric field. BTBT thus operates in a rather opposite manner to IHEI (see FIG. 6).

Figure 7A:
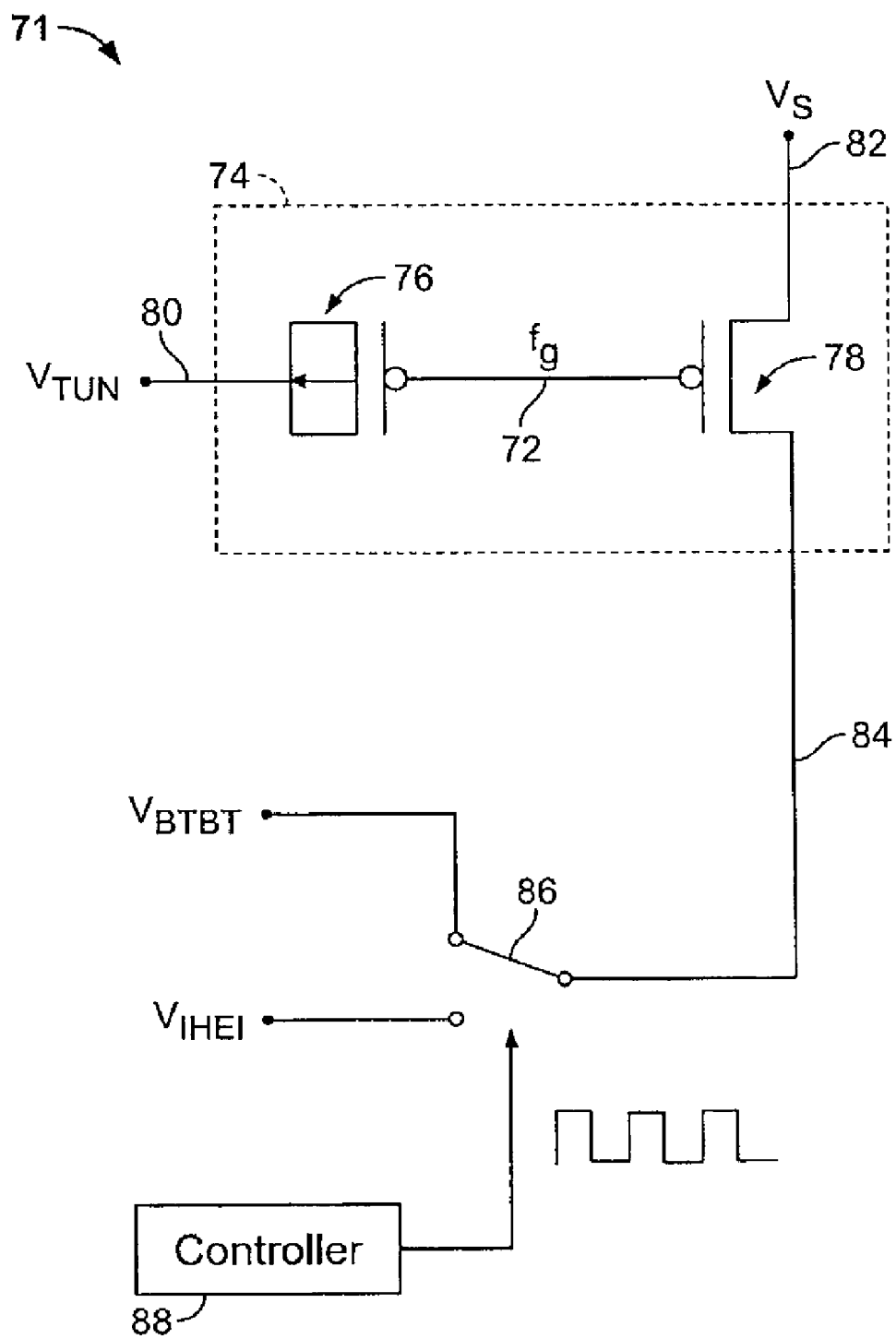
FIG. 7A is an electrical schematic diagram of an example of a programming apparatus which may be used to program the single-poly pFET-based NVM cell shown in FIGS. 9A and 9B (or other single-poly pFET-based nonvolatile memory cells) in accordance with an embodiment of the present invention.

According to an embodiment of the present invention, a combination of BTBT and IHEI is used to program a single-poly pFET-based nonvolatile memory cell and thereby avoid stuck bits. FIG. 7A is an electrical schematic diagram of an example of a programming apparatus which may be used to program the single-poly pFET-based NVM cell shown in FIGS. 9A and 9B (or other single-poly pFET-based nonvolatile memory cells) in accordance with an embodiment of the present invention. Programming apparatus 71 as shown in FIG. 7A, according to an embodiment of the present invention, may be used to add electrons to a floating gate 72 of a single-poly pFET-based nonvolatile memory cell 74. The single-poly pFET-based nonvolatile memory cell 74 is comprised of a tunneling junction 76 and a pFET 78, each of which has a common floating gate 72 embodying both the gate terminal of the pFET 78 and a first terminal of the tunneling junction 76. The tunneling junction 76 also includes a second terminal 80, which may be configured to receive a tunneling voltage VTUN that can be used to erase the single-poly pFET-based nonvolatile memory cell 74. The pFET 78 also has a source 82, which is configured to receive a source voltage, VS, and a drain 84, which is configured to receive either a BTBT programming voltage (VBTBT), or an IHEI programming voltage (VIHEI), depending on the position of a switch 86. (Switch 86 is intended to include any form or mechanism for switching current known to those of ordinary skill in the art). The switch 86 is controlled by a controller 88, which causes the switch 86 to alternately couple VBTBT and VIHEI to the drain 84 of pFET 78. Those of ordinary skill in the art will now realize that instead of using tunneling junction 76, other means may be used for removing electrons from floating gate 72. These include, by way of example, ultra-violet (UV) erase techniques which are well known.

Figure 7B:
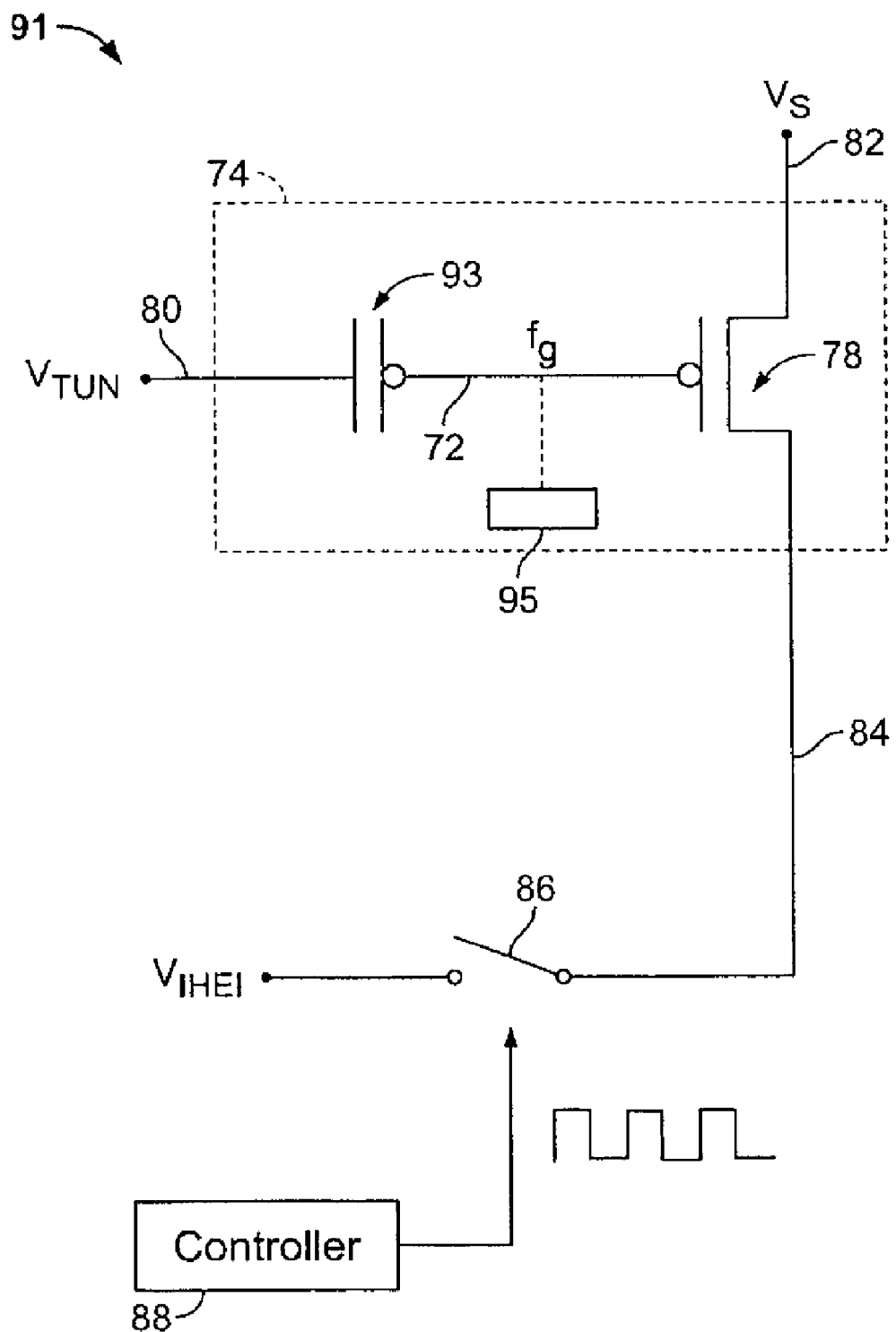
FIG. 7B is an electrical schematic diagram of an alternate example of the programming apparatus of FIG. 7A in accordance with an embodiment of the present invention.
Figure 8:
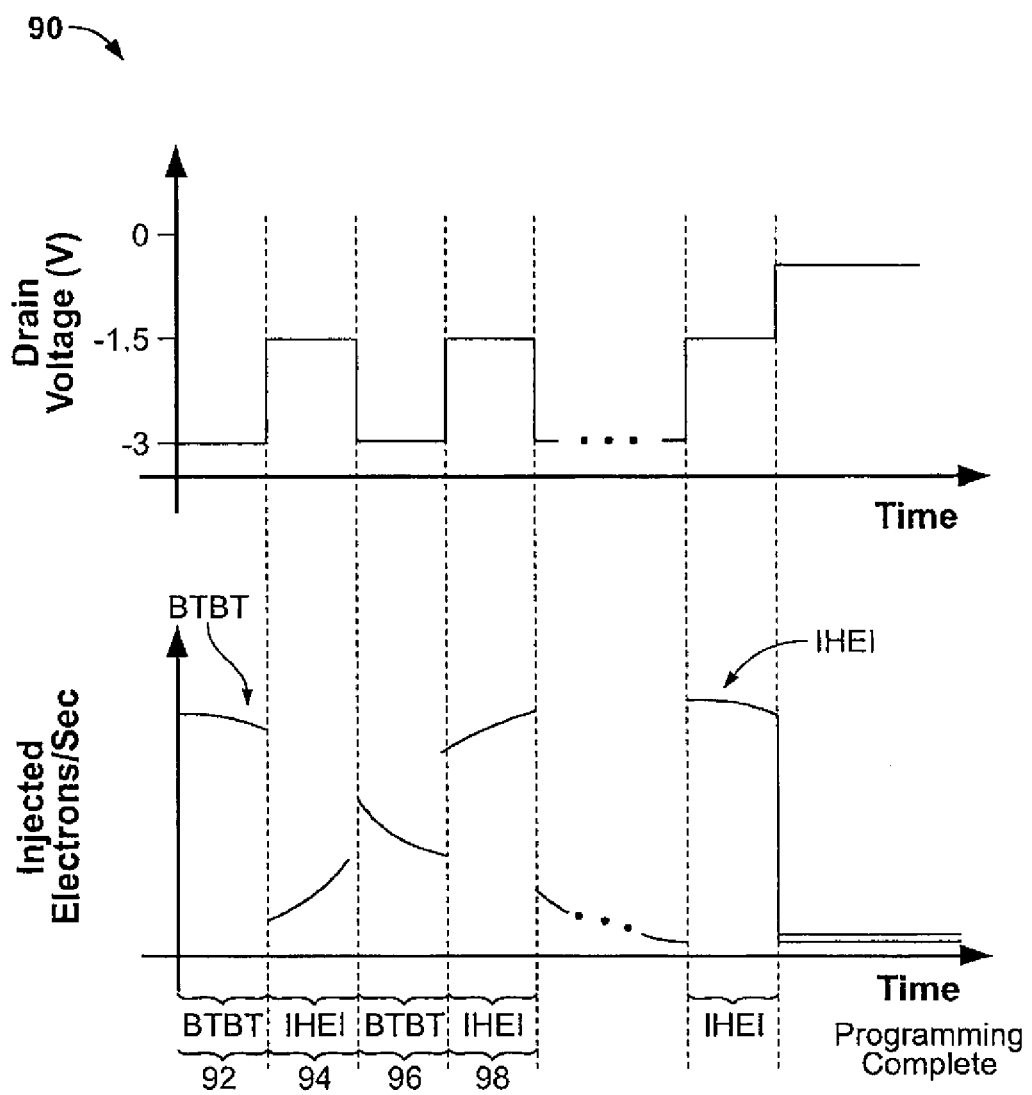
FIG. 8 is a timing diagram illustrating how the programming apparati of FIGS. 7A and 7B may be used to program single-poly pFET-based NVM cells in accordance with an embodiment of the present invention.

FIG. 8 is a timing diagram 90 illustrating how the single-poly pFET-based nonvolatile memory cell 71 in FIG. 7A may be programmed, in accordance with an embodiment of the present invention. During a first BTBT programming phase 92, VS (e.g. 3.3V) is applied to the source 82 of the single-poly pFET 78, the controller 88 causes the switch 86 to couple the BTBT programming voltage VBTBT (which may have a value of, for example, −3V) to the drain 84 of pFET 78. The applied VBTBT results in a large reverse bias across the p-n junction formed between the p− type drain 84 and the n− type well within which pFET 78 is formed. This large reverse bias induces BTBT in the drain-to-well p-n junction, whereby valence-band electrons tunnel directly from the silicon valence band into the conduction band. These conduction-band electrons are expelled from the drain-well junction by the relatively large electric field across the junction, and, if expelled with sufficient kinetic energy, may enter the conduction band of the gate dielectric and be collected by the floating gate. The floating-gate potential has a big influence on this process: if the floating-gate potential is near or above the well potential, the channel will be accumulated, enhancing the field across the p-n junction and causing more BTBT. One can ensure that the floating-gate potential is high by pulling VTUN high (such as to 5V in one embodiment—but never so high as to initiate and sustain F-N tunneling) during the BTBT injection operation. One should not pull VTUN so high as to cause Fowler-Nordheim tunneling, but it should be pulled high enough to facilitate BTBT. Indeed, BTBT can be caused merely by pulling VTUN high, without using controller 88 to switch the drain voltage to VBTBT as shown in FIG. 7A. A version of circuit 91 implementing this is shown in FIG. 7B. Controller 88 in this version only switches VIHEI on and off. VTUN is pulsed high enough through a capacitor-like device 93 coupled to floating gate 72 to cause BTBT injection without the need to provide VBTBT at the drain of pFET 78. Electrons are removed from the floating gate 72 via device 95 which may be a tunneling device, an ultraviolet erase mechanism, or any other know mechanism suitable for use in a pFET for removing electrons from its floating gate.

During the first BTBT programming phase 92, electrons collect on the floating gate 72. If a sufficient number are collected, current will begin to flow between source 82 and drain 84 of pFET 78. This is important since, despite the possibility that the single-poly pFET-based nonvolatile memory cell 71 had been previously over-erased (e.g., by overtunneling it), IHEI can now begin to be accomplished. Consequently, the stuck bit problem associated with single-poly pFET-based nonvolatile memory cells described above can be overcome.

Following the first BTBT programming phase 92, a first IHEI programming phase 94 is initiated, whereby controller 88 causes switch 86 to couple programming voltage VIHEI (which may have a value of, for example, −1.5V) to the drain 84 of pFET 78. Although the source current in pFET 78 may be small at the commencement of the first IHEI programming phase 94, as long as it is non-zero some electrons can inject onto the floating gate 72 (see FIG. 6 for the relationship between source current and gate current). Accordingly, during this phase holes may be accelerated from the source 82, across the newly formed channel, to the drain 84. As the accelerated holes traverse the channel and enter the drain-to-well depletion region they may collide with the semiconductor lattice, thereby generating hot electrons and hot holes. The hot holes are collected by the drain 84; the hot electrons are expelled from the drain depletion region with high kinetic energy (due to the high electric field present in the drain depletion region). Some of these high-energy electrons can be scattered upward, inject into the conduction band of the gate dielectric of pFET 78, and collect on floating gate 72.

Following the first IHEI programming phase 122, a second BTBT programming phase 124 may be initiated, whereby the controller 88 causes the switch 86 to once again couple the BTBT programming voltage VBTBT to the drain 84 of pFET 78. During this second BTBT programming phase the BTBT tunneling may be less effective, as shown in FIG. 8, due to the developed channel which reduces the electric field across the drain-to-well p-n junction. Nevertheless, to some degree BTBT tunneling may still ensue during the second BTBT programming phase 96, in a manner similar to that described above in connection with the first BTBT programming phase 92, and additional electrons may be injected onto the floating gate 72.

Following the second BTBT programming phase 96, a second IHEI programming phase 98 is initiated, whereby the control 88 causes the switch 86 to once again couple the VIHEI to the drain 84 of pFET 78. During this second IHEI programming phase 98 the IHEI efficiency may be improved from the IHEI efficiency that was present during the first IHEI programming phase 94. The improved IHEI efficiency is attributable to the more fully developed channel, which is capable of supporting a larger source current and, consequently, and larger gate current.

Additional and alternating BTBT and IHEI programming phases are applied, following the second IHEI programming phase 98, to fully program the single-poly pFET-based nonvolatile memory cell 71. As shown in FIG. 8, with the succession of each additional programming phase IHEI becomes more dominant and BTBT becomes less effective. At some point in the programming cycle the control 88 may decide to halt BTBT and perform exclusively IHEI programming, due to the larger gate current available with IHEI at large source currents.

Figure 11:
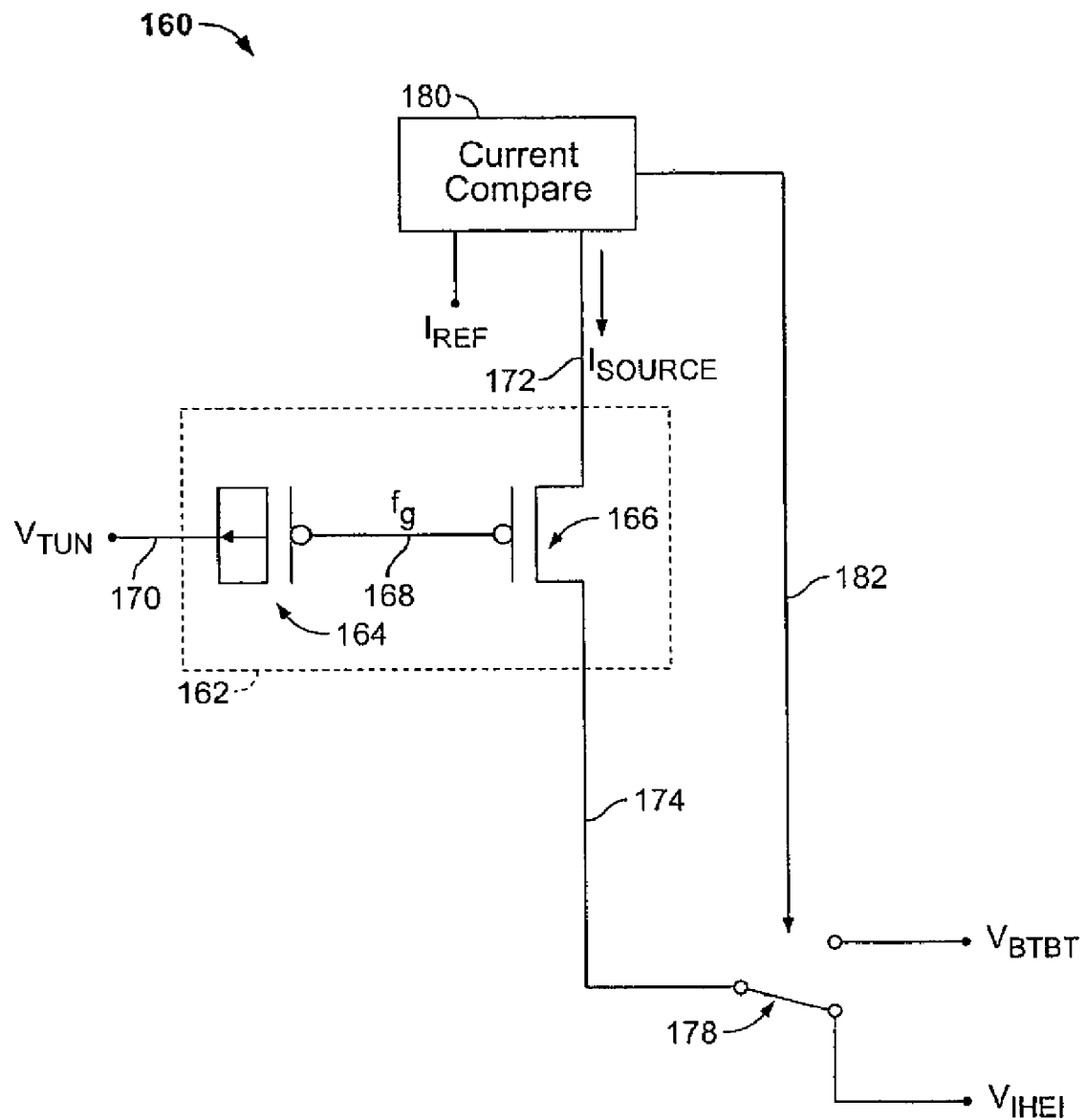
FIG. 11 is an electrical schematic block diagram showing a programming apparatus which may be used to program the single-poly pFET-based nonvolatile memory cells shown in FIGS. 9A and 9B (or other single-poly pFET-based nonvolatile memory cells), in accordance with an embodiment of the present invention.
Figure 12:
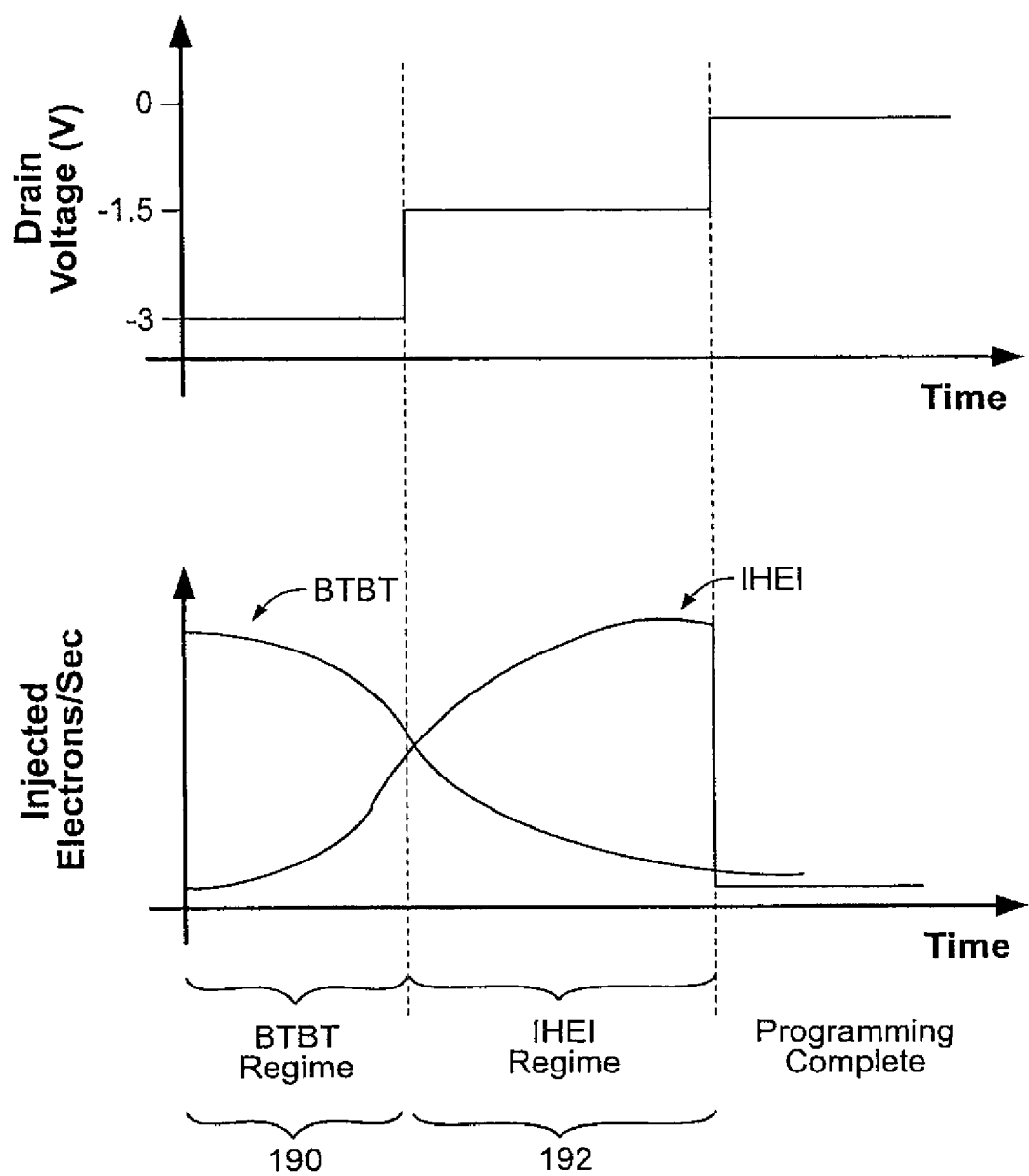
FIG. 12 is a timing diagram illustrating how the single-poly pFET-based nonvolatile memory cell of FIG. 11 may be programmed in accordance with an embodiment of the present invention.

Referring now to FIGS. 9A and 9B, there is shown a layout view (FIG. 9A) and a cross-sectional view (FIG. 9B) of a single-poly pFET-based nonvolatile memory cell 100, which may be programmed using the programming apparatus 70 shown in FIG. 7A and the programming method 90 shown in FIG. 8 or the programming apparatus shown in FIG. 11 and the programming method of FIG. 12, in accordance with embodiments of the present invention.

Note that the cross-sectional view in FIG. 9B is taken along line 9B-9B of FIG. 9A. As shown in FIGS. 9A and 9B, the single-poly pFET-based nonvolatile memory cell 100 is comprised of a pFET 102 and a tunneling junction 104 formed in one embodiment from a shorted pFET. A first n− well 106 and a second n− well 108 are formed in a p− doped substrate 110. A first p+ doped region 112 (source diffusion), which embodies the source of pFET 102, and a second p+ doped region 114 (drain diffusion), which embodies the drain of pFET 102, are both formed in the first n− well 106. A gate dielectric layer (e.g., a gate oxide such as silicon dioxide) 105 separates the first n− well 106 from a polysilicon layer, which serves as a floating gate 116 of the single-poly pFET 102. Source and drain terminals 120 and 122, in ohmic contact with the source and drain regions 112 and 114, respectively, are provided in a conventional manner. A tunneling junction terminal 124, which as alluded to above is formed by shorting the source, drain and well contacts 126, 128 and 130 of a pFET, is in ohmic contact with an n+ well contact region 132 disposed in the second n− well 108. The tunneling junction terminal 124 is configured to receive a tunneling voltage, VTUN, which can cause electrons to be removed from the floating gate 116 by Fowler-Nordheim tunneling. The first n− well 106 is separated from the second n− well 108 by a channel stop region 134, which may be formed using a conventional isolation process such as, for example, a LOCOS (Local Oxidation of Silicon) process or an STI (Shallow Trench Isolation) process. The floating gate 116 extends over the channel stop region 134 to form the polysilicon gate of the shorted-pFET tunneling junction 104. A dielectric layer 136 such as, for example, the gate dielectric layer 105 insulates the floating gate 116 from the n− well 108.

Figure 10A:
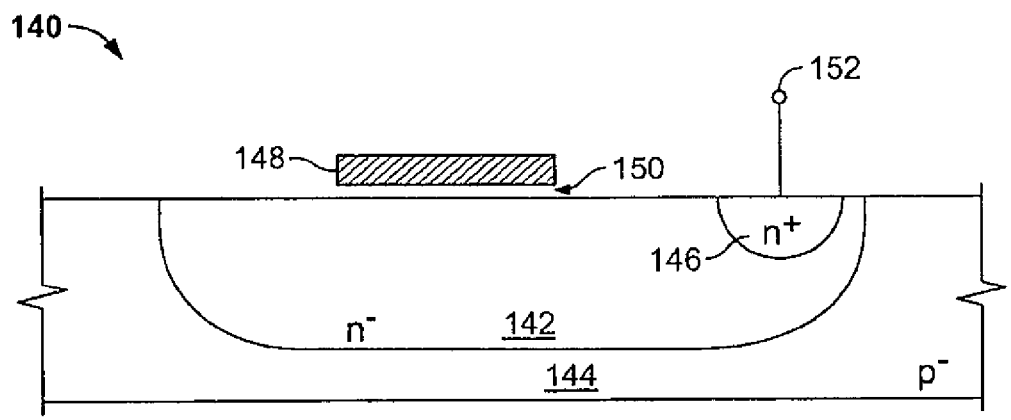
FIGS. 10A and 10B are cross-sectional views of MOS capacitor (e.g., MOSCAP) tunneling junctions, which may be used to remove electrons from a floating gate of a single-poly pFET of the single-poly pFET-based nonvolatile memory cell shown in FIGS. 9A and 9B.
Figure 10B:
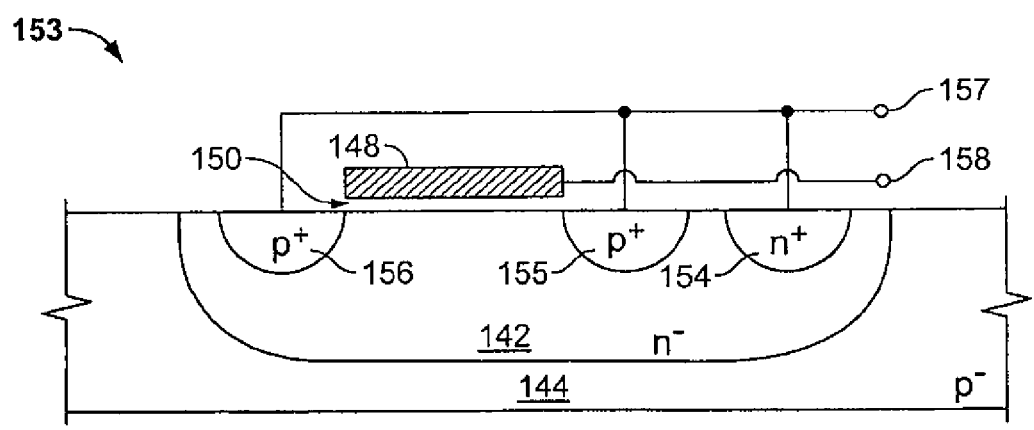

Whereas the tunneling junction 104 in FIGS. 9A and 9B is shown to be formed from a shorted pFET, the tunneling junction can also be implemented in various other ways. FIGS. 10A and 10B are cross-sectional views of MOS capacitor (e.g., MOSCAP) tunneling junctions, which may be used to remove electrons from a floating gate of a single-poly pFET of the single-poly pFET-based nonvolatile memory cell shown in FIGS. 9A and 9B. For example, a tunneling junction may be formed using MOS capacitor 140 (FIG. 10A) with an n− well 142 disposed in a p− substrate 144 and an n+ region 146 disposed in n− well 142. A floating gate 148 isolated from substrate 144 by a gate dielectric 150 overhangs a portion of n+ region 146. A tunneling conductor 152 carrying the VTUN signal is coupled to n+ region 146. FIG. 10B illustrates another MOSCAP 153 which differs from that of FIG. 10A in that it has an n+ well contact 154, a p+ source 155, a p+ drain 156 and terminals 157 and 158 across which the capacitance appears. Indeed, any capacitor structure, irrespective of the device from which it is formed may be used, as those of ordinary skill in the art will now readily appreciate and understand.

FIG. 11 is an electrical schematic block diagram showing a programming apparatus which may be used to program the single-poly pFET-based nonvolatile memory cells shown in FIGS. 9A and 9B (or other single-poly pFET-based nonvolatile memory cells), in accordance with an embodiment of the present invention.

FIG. 11 shows a programming apparatus 160, according to an alternative embodiment of the present invention, which may be used to program a single-poly pFET-based nonvolatile memory cell 162 (such as, for example, the pFET-based nonvolatile memory cell shown in FIGS. 9A and 9B, or a pFET-based nonvolatile memory cell using the MOSCAP tunneling junction (or an equivalent thereof) shown in FIG. 10). The single-poly pFET-based nonvolatile memory cell 162 is comprised of a tunneling junction 164 and a pFET 166, each of which has a common floating gate 168 embodying both the gate terminal of the pFET 166 and a first terminal of the tunneling junction 164. The tunneling junction 164 also includes a second terminal 170, which may be configured to receive a tunneling voltage VTUN that can be used to erase the single-poly pFET-based nonvolatile memory cell 162. The pFET 166 also has a source 172 and a drain 174, which is configured to receive either a BTBT programming voltage, VBTBT, or an IHEI programming voltage, VIHEI, depending on the configuration of a switch 178. A current compare circuit 180 compares the source current on line 172, ISOURCE, passing through pFET 166 to a reference current, IREF, and provides a control signal on a switch control line 182. As explained in more detail below, the value of IREF and application of the switch control signal are set to determine whether and when a BTBT programming voltage, VBTBT, or an IHEI programming voltage, VIHEI, is applied to the drain 174 of the single-poly pFET 166.

FIG. 12 is a timing diagram illustrating how the single-poly pFET-based nonvolatile memory cell 162 in FIG. 11 may be programmed, according to an embodiment of the present invention. During a BTBT programming regime 280, the switch control signal on switch control line 182 in FIG. 11 sets the switch 178 so that the BTBT programming voltage VBTBT (which may have a value of, for example, −3V) is coupled to the drain 174 of pFET 166, and a source voltage (e.g. 3.3V) is applied to the source 172 of pFET 166. The applied VBTBT results in a large reverse bias across the p-n junction formed between the p-type drain 174 and the n-type well within which pFET 166 is formed. This large reverse bias induces BTBT in the drain-to-well p-n junction, whereby valence-band electrons tunnel directly from the silicon valence band into the conduction band. These conduction-band electrons are expelled from the drain-well junction by the large electric field across the junction, and, if expelled with sufficient kinetic energy, may enter the conduction band of the gate dielectric and be collected by the floating gate 168.

During the first BTBT programming phase 190, electrons collect on the floating gate 168. If a sufficient number are collected, current will begin to flow between source 172 and drain 174. This is important since, despite the possibility that the single-poly pFET-based nonvolatile memory cell 162 had been previously over-erased (e.g., by overtunneling it), IHEI can now begin to be accomplished. Consequently, the stuck bit problem associated with single-poly pFET-based nonvolatile memory cells described above can be overcome.

After a sufficient number of electrons have been injected onto the floating gate 168 during the BTBT programming regime, and a conducting channel has formed between the source 172 and drain 174 of pFET 166, the probability that IHEI can be initiated and sustained increases. This is reflected in FIG. 6, which shows that IHEI gate current increases with source current. Accordingly, once a sufficient conducting channel has been formed to support IHEI, the current compare circuit 180 transmits a switch control signal on the switch control line 182 so that the IHEI programming voltage VIHEI (which may have a value of, for example, −1.5V) is coupled to the drain 174 of pFET 166. The current compare circuit 180 (which may be of any conventional design) sends this switch control signal depending on the value of the reference current IREF.

Once the current compare circuit 180 causes the switch 178 to switch from the BTBT programming voltage to the IHEI programming voltage, the programming process enters an IHEI programming regime 192 (FIG. 12). In the IHEI programming regime 192 IHEI occurs and, as explained in detail above, electrons are injected onto the floating gate 168 until the desired floating-gate voltage is attained.

Those of ordinary skill in the art will now recognize that the NVM described herein may be configured as single-ended memory or as differential memory, or in other ways in which memory is commonly used without departing from the inventive concepts disclosed herein.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. A method for programming a single-poly pFET-based nonvolatile memory cell, comprising:
    providing a single-poly pFET-based non-volatile memory cell having a single-poly pFET including a source, a drain and a floating gate;
    applying a reverse-bias voltage across a p-n junction formed between the drain and an n-type semiconductor region within which the drain is formed, said reverse-bias voltage sufficient to generate electrons by band-to-band tunneling (BTBT);
    injecting electrons generated by BTBT onto the floating gate;
    comparing a source current of said single-poly pFET to a reference current;
    upon the source current becoming greater than the reference current, biasing the single-poly pFET to induce impact-ionized hot-electron injection (IHEI); and
    injecting electrons generated by IHEI onto the floating gate.

2. The method of claim 1, wherein the single-poly pFET-based nonvolatile memory cell has a stuck bit prior to applying the reverse-bias across the p-n junction.

3. The method of claim 2, wherein the electrons generated by BTBT and injected onto the floating gate cause the stuck bit to be removed.

4. The method of claim 1, wherein the single-poly pFET-based nonvolatile memory cell had been previously over-erased prior to applying the reverse-bias voltage across the p-n junction.

5. The method of claim 4, wherein the electrons generated by BTBT and injected onto the floating gate cause the over-erased condition to be removed.

6. A programming apparatus for programming a single-poly pFET-based nonvolatile memory cell having a single-poly pFET including a drain, a source and a floating gate, said programming apparatus comprising:
    a current compare circuit operable to compare a source current flowing through the single-poly pFET to a reference current;
    a switch operable to couple either a band-to-band tunneling (BTBT) voltage or an impact-ionized hot-electron injection (IHEI) voltage to the drain of the single-poly pFET; and
    a switch control line configured to transmit a switch control signal from said current compare circuit to said switch.

7. The programming apparatus of claim 6, wherein the switch is configured to couple the BTBT voltage to the drain of the single-poly pFET when the source current is less than the reference current.

8. The programming apparatus of claim 6, wherein the switch is configured to couple the IHEI voltage to the drain of the single-poly pFET when the source current is greater than the reference current.

9. The programming apparatus of claim 6, wherein the current compare circuit is further operable to provide a switch control signal to cause said switch to switch from coupling the BTBT voltage to the drain of the single-poly pFET to coupling the IHEI voltage to the drain of the single-poly pFET upon the current compare circuit determining that the source current has exceeded the reference current.

10. The programming apparatus of claim 7, wherein the single-poly pFET-based nonvolatile memory cell has a stuck bit prior to being programmed by the programming apparatus.

11. The programming apparatus of claim 10, wherein electrons generated by BTBT and injected onto the floating gate cause the stuck bit to be removed.

12. The programming apparatus of claim 7, wherein the single-poly pFET-based nonvolatile memory cell had been previously overerased prior to being programmed by the programming apparatus.

13. The programming apparatus of claim 12, wherein electrons generated by BTBT and injected onto the floating gate cause the overerased condition to be removed.

* * * * *